(12) United States Patent
Koiwa

(10) Patent No.: US 6,809,391 B1
(45) Date of Patent: Oct. 26, 2004

(54) SHORT-WAVELENGTH PHOTODIODE OF ENHANCED SENSITIVITY WITH LOW LEAK CURRENT AND METHOD OF MANUFACTURING PHOTODIODE

(75) Inventor: Sumio Koiwa, Chiba (JP)

(73) Assignee: Seiko Instruments Inc., Chiba (JP)

(*) Notice: Subject to any disclaimer, the term of this patent is extended or adjusted under 35 U.S.C. 154(b) by 0 days.

(21) Appl. No.: 09/638,194

(22) Filed: Aug. 11, 2000

(30) Foreign Application Priority Data

Oct. 18, 1999 (JP) .......................................... 11-295840

(51) Int. Cl.$^7$ ............................................. H01L 31/06
(52) U.S. Cl. ........................ 257/465; 257/461; 257/463; 257/464; 257/466
(58) Field of Search ................................ 257/461, 463, 257/464–466, 436–437, 532, 186, 184

(56) References Cited

FOREIGN PATENT DOCUMENTS

JP    07106415 A  * 4/1995

OTHER PUBLICATIONS

Wen–Shiung Lour and Chung–Cheng Chang, VPE Grown ZnSe/Si PIN–like Visible Photodiodes, Solid–State Electronics, vol. 39, No. 9, pp. 1295–1298 (1996), Pergamon/Elsevier Ltd.*

Chang Song Yin, "The p–i–n Junction–Surface Depletion-Layer Photodiode", IEEE Electron Device Letters, vol. 12, No. 8, pp. 442–443 (1991).*

Landolt–Bornstein—Group III Condensed Matter, Springer Verlag Heidelberg, vol. 41 B/1999, "zinc selenide (ZnSe), free carrier mobilities, Hall coefficient, magnetoresistance", Figure 4 ("hole mobilities vs carrier concentration @ 300K"(ISSN: 1616–9549)).*

S.M. Sze, "Physics of Semiconductor Devices", Second Edition, John Wiley and Sons, 13.3.2 (pp. 754–755) (1981).*

* cited by examiner

Primary Examiner—Nathan J. Flynn
Assistant Examiner—Johannes Mondt
(74) Attorney, Agent, or Firm—Adams & Wilks

(57) ABSTRACT

A photodiode comprises an optical detection portion for detecting an optical signal and outputting a photoelectric conversion signal. The optical detection portion has a semiconductor substrate of a first conductive type and semiconductor layers of a second conductive type formed in spaced-apart relation in a surface of the semiconductor subtrate. A depletion layer is formed in the semiconductor subtrate by application of a reverse bias to the photodiode so as to surround the semiconductor layers. An etched surface portion of the depletion layer is disposed between the semiconductor layers so that an interface level region of the surface of the semiconductor substrate does not exist between the semiconductor layers.

9 Claims, 1 Drawing Sheet

SHORT-WAVELENGTH PHOTODIODE OF ENHANCED SENSITIVITY WITH LOW LEAK CURRENT AND METHOD OF MANUFACTURING PHOTODIODE

BACKGROUND OF THE INVENTION

1. Field of the Invention

The present invention relates to a photodiode, and particularly to a structure for improving the short wavelength region photo sensitivity of a photodiode, and to a method of manufacturing the photodiode.

2. Description of the Related Art

Conventionally, a photodiode is used as an optical detection element, for example, as a signal detection element of an optical pickup. In recent years, because of an increase in capacity of an optical disk, there has been proposed optical disk readout by a short wavelength semiconductor laser with blue light or violet light. Thus, the short wavelength region photo sensitivity of the photodiode becomes very important.

FIG. 2 is a sectional view of a conventional photodiode.

In FIG. 2, the photodiode is constituted by a first conductive type semiconductor region 1, for example, an N-type silicon semiconductor substrate, and a second conductive type semiconductor layer 2 formed on the surface of the first conductive type semiconductor region 1, for example, a P-type diffusion layer. An antireflection film 5, for example, an oxide film is formed on the photodiode. A reverse bias is applied to the first conductive type semiconductor region 1 and the second conductive type semiconductor layer 2, and when light is irradiated to a depletion layer 3 formed by the reverse bias application, an optical signal is generated in the depletion layer 3.

The depth of the second conductive type semiconductor layer 2 of the photodiode in FIG. 2 is optimized in accordance with a wavelength to be detected, and for example, in the case where red light of a wavelength of about 800 nm is detected, the depth of the second conductive type semiconductor layer 2 is made about 3 $\mu$m. In the case where blue or violet light of a wavelength of about 400 nm is detected, light of a wavelength of about 400 nm is easily absorbed by silicon and is almost absorbed in a depth of about 1 $\mu$m. Thus, in order to detect short wavelength light of a wavelength of about 400 nm in a conventional photodiode, it is necessary that the depth of the second conductive type semiconductor layer 2 is made 1 $\mu$m or less. However, in the conventional photodiode, since it is difficult to control the depth of the second conductive type semiconductor layer 2 so that the depth becomes 1 $\mu$m or less, there has been a problem that light sensitivity in a short wavelength region is inferior.

If a plurality of second conductive type semiconductor layers 2 are formed as in a photodiode shown in FIG. 3, a depletion layer 3 is formed on the surface of a first conductive type semiconductor region between the second conductive type semiconductor layers 2a and 2b, so that the photo sensitivity in a short wavelength region is improved. However, an interface level 4 is formed on the surface of the first conductive type semiconductor region between the second conductive type semiconductor layers 2a and 2b, and an optical signal generated in the depletion layer 3 between the second conductive type semiconductor layers 2a and 2b is trapped by the interface level 4, so that there has been a problem that the photo sensitivity is lowered and leak current is increased.

SUMMARY OF THE INVENTION

The present invention has been made in view of the foregoing drawbacks in the conventional art, and has an object to provide a photodiode which can improve the photo sensitivity in a shorter wavelength region, as compared with a conventional photodiode, without increasing leak current.

In order to solve the above-mentioned problem, according to the present invention, a photodiode includes a first conductive type semiconductor region, and a plurality of second conductive type semiconductor layers formed on the surface of the first conductive type semiconductor region, the first conductive type semiconductor region and the plurality of second conductive type semiconductor layers constituting an optical detection portion for detecting an optical signal and outputting its photoelectric conversion signal, wherein the surface of the first conductive type semiconductor region between the second conductive type semiconductor layers is removed. By this construction, since the surface of the first conductive type semiconductor region between the second conductive type semiconductor layers is removed, the interface level of the surface of the first conductive type semiconductor region between the second conductive type semiconductor layers is removed.

Furthermore, the surface of the first conductive type semiconductor region is removed by a wet etching method, so that the region can be removed without generating an interface level due to etching damage.

In the photodiode of the present invention, the plurality of second conductive type semiconductor layers are formed on the surface of the first conductive type semiconductor region.

When a reverse bias is applied to the photodiode constituted by the first conductive type semiconductor region and the second conductive type semiconductor layers, a depletion layer is extended in accordance with the bias voltage. Since the depletion layer is extended not only in the vertical direction but also in the horizontal direction, the depletion layer is extended not only in the vertical direction but also in the horizontal direction, the depletion layer is also formed on the surface of the first conductive type semiconductor region, and the photo sensitivity in a short wavelength region is improved. At this time, the respective second conductive type semiconductor layers are made to have the same potential. Thus, when the distance between the second conductive type semiconductor layers is made about twice the width of the depletion layer, since the depletion layers of adjacent photodiodes formed of the first conductive type semiconductor region and the second conductive type semiconductor layers just come in contact with each other, the efficiency is excellent.

Further, in the first conductive type semiconductor region between the second conductive type semiconductor layers, the interface level is formed on the surface of the first conductive type semiconductor region, and by removing the interface level, the leak current can be controlled without greatly influencing the photo sensitivity of the photodiode.

Furthermore, when the interface level of the surface of the first conductive type semiconductor region is removed by using the wet etching method, the interface level can be removed without generating an interface level due to etching damage.

DETAILED DESCRIPTION OF THE PREFERRED EMBODIMENT

Figure 1:
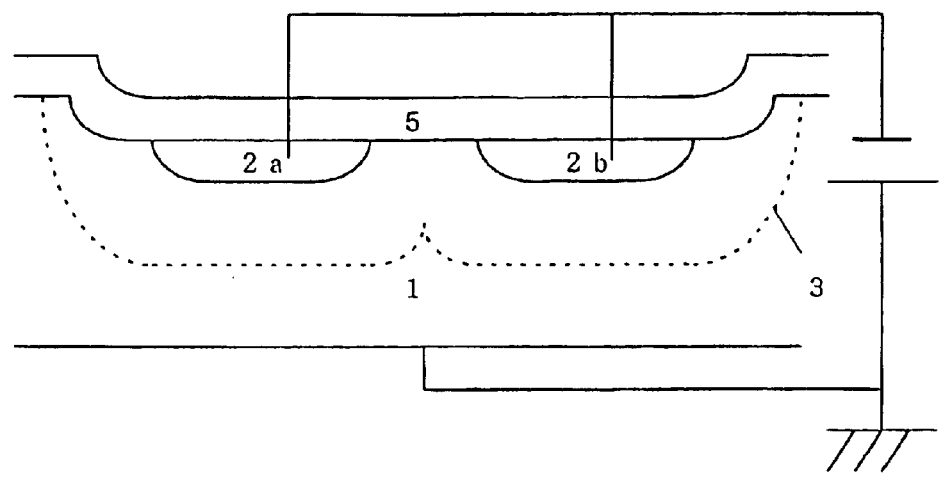
FIG. 1 is a schematic sectional view showing a photodiode of the present invention.
Figure 2:
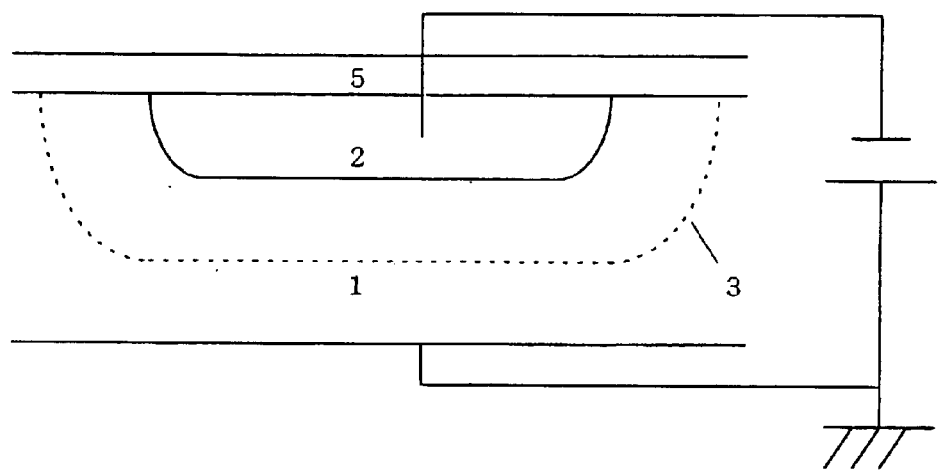
FIG. 2 is a second schematic sectional view showing a conventional photodiode.
Figure 3:
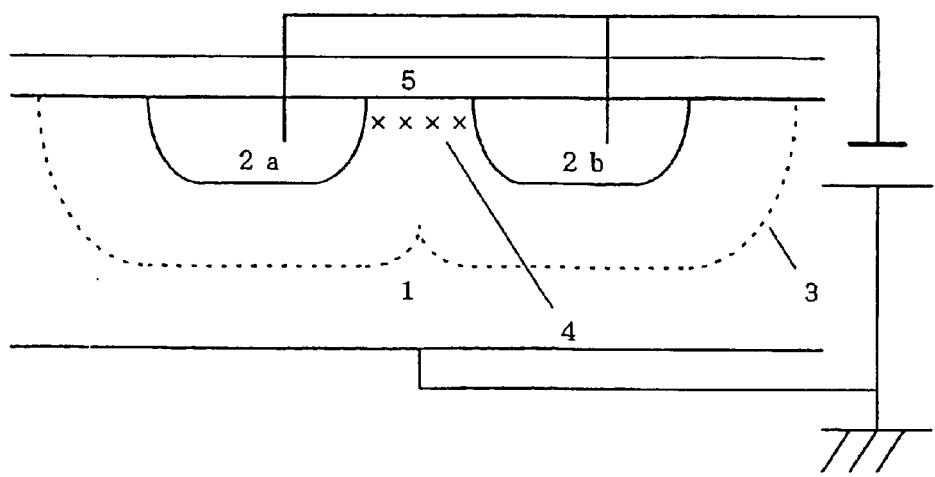
FIG. 3 is a first schematic sectional view showing a conventional photodiode.

An embodiment of the present invention will be described below with reference to the drawings. FIG. 1 is a schematic sectional view showing an embodiment of a photodiode of the present invention.

In FIG. 1, a plurality of second conductive type semiconductor layers 2a and 2b, for example, P-type impurity diffusion layers are formed on the surface of a first conductive type semiconductor region 1, for example, an N-type silicon semiconductor substrate. The first conductive type semiconductor region 1 and the second conductive type semiconductor layers 2a and 2b are reversely biased so that a depletion layer 3 is formed. The plurality of second conductive type semiconductor layers 2a and 2b are electrically connected to each other, and the second conductive type semiconductor layers 2a and 2b have the same potential.

The interface level of the surface of the first conductive type semiconductor region 1 between the second conductive type semiconductor layers 2a and 2b is removed by a wet etching method, for example, wet etching using a silicon etching solution of KOH, EPW (ethylene diamine pyrocatechol & water), TMAH (tetramethylammonium hydrooxide), HF+HNO$_3$, or the like. It is needless to say that the removal of the interface level of the surface of the first conductive type region 1 has only to be carried out at least at a portion between the second conductive type semiconductor layers 2a and 2b.

It is understood that the respective conductive types may be reversed. For example, a plurality of first conductive type semiconductor layers are formed on a second conductive type semiconductor region, and the interface level of the surface of the second conductive type semiconductor region between the first conductive type semiconductor layers is removed by a wet etching method.

Further, it is understood that a portion between the second conductive type semiconductor layers is not limited to a only one portion, but plural portions may be formed.

As described above, the photodiode of the present invention has effects as set forth below.

The plurality of second conductive type semiconductor layers are formed on the surface of the first conductive type semiconductor region, and a reverse bias is applied to the first conductive type semiconductor region and the second conductive type semiconductor layers, so that the depletion layer is formed on the surface of the first conductive type semiconductor region between the second conductive type semiconductor layers, and the photo sensitivity in a short wavelength region is improved.

Further, when the distance between the second conductive type semiconductor layers is made 0.5 to 2 times the width of the depletion layer in the horizontal direction formed by the reverse bias, since the depletion layers of adjacent photodiodes formed of the first conductive type semiconductor region and the second conductive type semiconductor layers come in contact with each other, it becomes possible to detect an optical signal with excellent area efficiency.

Furthermore, since the interface level of the surface of the first conductive type semiconductor region between the second conductive type semiconductor layers is removed, the leak current can be suppressed without greatly influencing the photo sensitivity.

Furthermore, since the interface level of the surface of the first conductive type semiconductor region between the second conductive type semiconductor layers is removed by using the wet etching method, the interface level can be removed without generating an interface level due to etching damage.

What is claimed is:

1. A photodiode comprising:
    an optical detection portion for detecting an optical signal and outputting a photoelectric conversion signal, the optical detection portion having a semiconductor substrate of a first conductive type, a plurality of semiconductor layers of a second conductive type formed in spaced-apart relation in a surface of the semiconductor substrate, and a depletion layer formed in the semiconductor substrate by application of a reverse bias to the photodiode so as to surround the semiconductor layers, the depletion layer having an etched surface portion disposed between the semiconductor layers so that an interface level region of the surface of the semiconductor substrate does not exist between the semiconductor layers.

2. A photodiode according to claim 1; wherein a distance between the semiconductor layers is 0.5 to 2 times a width of the depletion layer.

3. A photodiode according to claim 1; wherein the etched surface portion of the depletion layer comprises a wet-etched surface portion.

4. A photodiode according to claim 1; wherein the first conductivity type comprises n-type conductivity.

5. A photodiode according to claim 4; wherein the second conductivity type comprises p-type conductivity.

6. A photodiode according to claim 1; wherein the first conductivity type comprises p-type conductivity.

7. A photodiode according to claim 6; wherein the second conductivity type comprises n-type conductivity.

8. A photodiode comprising:
    an optical detection portion for detecting an optical signal and outputting a photoelectric conversion signal, the optical detection portion having a semiconductor substrate of a first conductive type and a plurality of semiconductor layers of a second conductive type disposed in spaced-apart relation in a surface of the semiconductor substrate so that an interface level region of the surface of the semiconductor substrate does not exist between the semiconductor layers.

9. A photodiode according to claim 8; wherein the first conductive type is different from the second conductive type.

* * * * *